(12) United States Patent
Close et al.

(10) Patent No.: US 11,921,173 B2
(45) Date of Patent: Mar. 5, 2024

(54) DEVICE AND METHOD FOR DETERMINING AN ORIENTATION OF A MAGNET, AND A JOYSTICK

(71) Applicant: Melexis Technologies SA, Bevaix (CH)

(72) Inventors: Gael Close, Bevaix (CH); Nicolas Dupre, Bevaix (CH); Jean-Claude Depoorter, Tessenderlo (BE); Yves Bidaux, Bevaix (CH)

( * ) Notice: Subject to any disclaimer, the term of this patent is extended or adjusted under 35 U.S.C. 154(b) by 0 days.

(21) Appl. No.: 17/838,684

(22) Filed: Jun. 13, 2022

(65) Prior Publication Data

US 2022/0404443 A1    Dec. 22, 2022

(30) Foreign Application Priority Data

Jun. 18, 2021   (EP) .................................... 21180417

(51) Int. Cl.
*G01R 33/10*      (2006.01)
*G05G 9/047*      (2006.01)

(52) U.S. Cl.
CPC ............. *G01R 33/10* (2013.01); *G05G 9/047* (2013.01)

(58) Field of Classification Search
CPC .......................... G01R 33/10; G01R 33/0005; G01R 33/0011; G01R 33/022; G01R 33/072; G01R 33/091; G05G 9/047; G05G 2009/04755; G01D 5/145; G01D 5/147; G01B 7/003; G01B 7/30
USPC ................................................... 324/207.21
See application file for complete search history.

(56) References Cited

U.S. PATENT DOCUMENTS

| 2004/0018644 | A1* | 1/2004  | Johnson ............... G01R 33/022 324/207.13 |
| 2007/0016006 | A1* | 1/2007  | Shachar ................. A61B 5/062 600/407 |
| 2015/0022192 | A1* | 1/2015  | Ausserlechner ..... G01R 33/022 324/207.25 |
| 2019/0195657 | A1* | 6/2019  | Bilbao De Mendizabal ............... G01D 5/24457 |
| 2020/0243285 | A1* | 7/2020  | Wang ................... G01R 33/077 |
| 2020/0271479 | A1  | 8/2020  | Wang et al. |
| 2020/0370877 | A1* | 11/2020 | Bidaux .................. G01R 33/07 |

(Continued)

FOREIGN PATENT DOCUMENTS

EP          3875915 A1     9/2021

OTHER PUBLICATIONS

Extended EP Search Report from corresponding European Application No. 21180417.4, dated Nov. 19, 2021.

*Primary Examiner* — Christopher P McAndrew
(74) *Attorney, Agent, or Firm* — Workman Nydegger

(57) ABSTRACT

A method of determining an orientation $\alpha,\beta$ of a magnet which is pivotable about a reference position having a predefined position relative to a semiconductor substrate, comprising: a) determining at least two of the following magnetic field gradients: i) a first magnetic field gradient dBx/dx; ii) a second magnetic field gradient dBy/dy; iii) a third magnetic field gradient dBz/dx; iv) a fourth magnetic field gradient dBz/dy; b) determining a first angle $\alpha$ based on at least one of the magnetic field gradients; c) determining a second angle $\beta$ based on at least one of the magnetic field gradients. A sensor device is configured for performing this method. A sensor system includes such sensor device and a magnet, optionally connected to a joystick.

18 Claims, 10 Drawing Sheets

(56) References Cited

U.S. PATENT DOCUMENTS

2021/0055131 A1  2/2021  Dupre et al.
2021/0110239 A1  4/2021  Heinz et al.

\* cited by examiner gr1=(dBx/dx)=Bx2-Bx1=(h4-h3)-(h2-h1)
gr2=(dBz/dx)=Bz2-Bz1=(h4+h3)-(h2+h1)
gr3=(dBy/dy)=By4-By3=(h8-h7)-(h6-h5)
gr4=(dBz/dy)=Bz4-Bz3=(h8+h7)-(h6+h5)

α = K1*atan2(gr2,gr1)    or    α = K1*atan2(K3*gr2,gr1)
β = K2*atan2(gr4,gr3)           β = K2*atan2(K4*gr4,gr3)

gr1=(dBx/dx)=Bx2-Bx1=(v2-v1)
gr2=(dBz/dx)=Bz2-Bz1=(h2-h1)
gr3=(dBy/dy)=By4-By3=(v4-v3)
gr4=(dBz/dy)=Bz4-Bz3=(h4-h3)

α = K1*atan2(gr2,gr1)     or     α = K1*atan2(K3*gr2,gr1)
β = K2*atan2(gr4,gr3)              β = K2*atan2(K4*gr4,gr3)

DEVICE AND METHOD FOR DETERMINING AN ORIENTATION OF A MAGNET, AND A JOYSTICK

FIELD OF THE INVENTION

The present invention relates in general to the field of magnetic position sensor systems, devices and methods, and more in particular to magnetic position sensor systems for measuring an orientation of a magnet which is pivotable about a fixed reference point. The present invention is also related to a position sensor system wherein said magnet is connected to a joystick.

BACKGROUND OF THE INVENTION

Magnetic position sensor systems, in particular linear or angular position sensor systems are known in the art. Many variants of position sensor systems exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), having only one degree of freedom (translation or rotation), having two degrees of freedom (e.g. one translation and one rotation, or two rotations), etc.

In many known systems, the system has only one degree of motional freedom, e.g. rotation about a single axis, or translation along a single axis.

Magnetic position sensor systems where the magnet has at least two degrees of freedom, are also known in the art, for example from EP21159804.0 filed on 28 Feb. 2021 disclosing a magnet movable along an axis and rotatable about said axis; or from US2021/0110239(A1) disclosing a circuit comprising at least one trained neural network for determining information about a position, attitude, or orientation of a magnet. These examples show that position sensor systems wherein the magnet has at least 2 degrees of freedom are much more complicated than systems having only 1 degree of freedom.

There is always room for improvements or alternatives.

SUMMARY OF THE INVENTION

It is an object of embodiments of the present invention to provide a sensor device, a position sensor system, and a method for determining an orientation $(\alpha,\beta)$ of a magnet.

It is an object of embodiments of the present invention to provide a sensor device, a position sensor system, and a method for determining an orientation $(\alpha,\beta)$ of a cylindrical magnet which is pivotable about a fixed reference point. The fixed reference point may be situated at a predefined height above or below a semiconductor substrate ("above" meaning at the same side of the substrate as the magnet, "below" meaning at the opposite side of the substrate as the magnet).

It is a particular object of embodiments of the present invention to provide a sensor device, a position sensor system, and a method for determining an orientation $(\alpha,\beta)$ of an axis of an axially magnetized cylindrical magnet which is pivotable about a reference position located on a semiconductor substrate.

In preferred embodiments, the orientation is determined in a manner which is highly robust against an external disturbance field (also know as "strayfield").

It is a particular object of embodiments of the present invention to provide a joystick comprising such a magnet, wherein an orientation of the joystick is determined with improved accuracy, e.g. in a manner which is substantially insensitive to an external disturbance field.

These objectives are accomplished by embodiments of the present invention.

According to a first aspect, the present invention provides a sensor device for determining an orientation of a magnet (e.g. a two-pole magnet) having an axis, the sensor device comprising: a semiconductor substrate comprising a plurality of magnetic sensors configured for determining at least two of the following magnetic field gradients: i) a first magnetic field gradient (e.g. dBx/dx) of a first magnetic field component oriented in a first direction parallel to the semiconductor substrate along said first direction; and ii) a second magnetic field gradient (e.g. dBy/dy) of a second magnetic field component oriented in a second direction parallel to the semiconductor substrate and perpendicular to the first direction, along said second direction; and iii) a third magnetic field gradient (e.g. dBz/dx) of a third magnetic field component oriented in a third direction perpendicular to the semiconductor substrate along said first direction; and iv) a fourth magnetic field gradient (e.g. dBz/dy) of the third magnetic field component oriented in the third direction along said second direction; the sensor device further comprises a processing circuit configured for determining a first angle (e.g. $\alpha$) and a second angle (e.g. $\beta$) based on at least some of said magnetic field gradients.

In an embodiment, the sensor elements are configured for determining only two magnetic field gradients, namely: dBz/dx and dBz/dy; and the processing unit is configured for determining the first angle (e.g. $\alpha$) as a function of only one magnetic field gradient, namely: dBz/dx, and for determining the second angle (e.g. $\beta$) as a function of only one other magnetic field gradient, namely: dBz/dy.

The first angle may be formed between an orthogonal projection of the axis A of the magnet on a first virtual plane XZ parallel to the first direction X and the third direction Z, and the second angle may be formed between an orthogonal projection of the axis A of the magnet on a second plane YZ parallel to the second direction Y and the third direction Z.

The magnet may be a cylindrical magnet.

The magnet may be a two-pole magnet, e.g. a cylindrical two-pole magnet, or a two-pole bar magnet, or a two-pole spherical magnet.

The magnet may be an axially magnetised ring magnet or an axially magnetised disk magnet.

The cylindrical magnet may have an external diameter in the range from 3.0 mm to 15.0 mm, or in the range from 4.0 mm to 12.0 mm, or in the range from 4.0 mm to 10.0 mm.

The cylindrical magnet may have a height H (in the axial direction), and an outer diameter D such that a ratio (H/D) of this height and of the external diameter is a value in the range from 20% to 100%, of in the range from 20% to 80%, or in the range from 25% to 75%, e.g. equal to about 50%.

In an embodiment, the processing circuit is configured for determining the first angle based on at least the first magnetic field gradient (e.g. dBx/dx) and the third magnetic field gradient (e.g. dBz/dx), and for determining the second angle solely based on at least the second magnetic field gradient (e.g. dBy/dy) and the fourth magnetic field gradient (e.g. dBz/dy).

In an embodiment, the processing circuit is configured for determining the first angle solely based on the first magnetic field gradient (e.g. dBx/dx) and the third magnetic field gradient (e.g. dBz/dx), and for determining the second angle solely based on the second magnetic field gradient (e.g. dBy/dy) and the fourth magnetic field gradient (e.g. dBz/dy).

In an embodiment, the plurality of magnetic sensors comprises a first sensor, a second sensor, a third sensor and a fourth sensor; the first sensor being located at a first sensor location and the second sensor being located at a second sensor location, situated on a first virtual line oriented in the first direction, and spaced apart from each other by a first distance, the first sensor being configured for measuring a first magnetic field component oriented in the first direction and a second magnetic field component oriented in the third direction, the second sensor being configured for measuring a third magnetic field component oriented in the first direction and a fourth magnetic field component oriented in the third direction; the third sensor being located at a third sensor location and the fourth sensor being located at a fourth sensor location, situated on a second virtual line oriented in the second direction, and spaced apart from each other by a second distance, the third sensor being configured for measuring a fifth magnetic field component oriented in the second direction and a sixth magnetic field component oriented in the third direction, the fourth sensor being configured for measuring a seventh magnetic field component oriented in the first direction and an eighth magnetic field component oriented in the third direction.

Using such configuration, the first magnetic field gradient (e.g. dBx/dx) may be based on a difference between the first and the third magnetic field component; the second magnetic field gradient (e.g. dBz/dx) may be based on a difference between the second and the fourth magnetic field component; the third magnetic field gradient (e.g. dBy/dy) may be based on a difference between the fifth and the seventh magnetic field component; and the fourth magnetic field gradient (e.g. dBz/dy) may be based on a difference between the sixth and the eighth magnetic field component.

In an embodiment, the first angle ($\alpha$) is determined in accordance with the formula:
$\alpha$=K1*a tan 2(dBz/dx, dBx/dx), wherein $\alpha$ is the first angle, a tan 2( ) is the two-argument arctangent function, dBx/dx is the first magnetic field gradient, and dBz/dx is the third magnetic field gradient, and K1 is a first predefined constant; and the second angle ($\beta$) is determined in accordance with the formula:
$\beta$=K2*a tan 2(dBz/dy, dBy/dy), wherein $\beta$ is the second angle, a tan 2( ) is the two-argument arctangent function, dBy/dy is the second magnetic field gradient, dBz/dy is the fourth magnetic field gradient, and K2 is a second predefined constant.

In an embodiment, the first angle ($\alpha$) is determined in accordance with the formula: $\alpha$=K1*a tan 2(K3*dBz/dx, dBx/dx), wherein $\alpha$ is the first angle, a tan 2( ) is the two-argument arctangent function, dBx/dx is the first magnetic field gradient, dBz/dx is the third magnetic field gradient, and K1 and K3 are predefined constants; and wherein the second angle ($\beta$) is determined in accordance with the formula: $\beta$=K2*a tan 2(K4*dBz/dy, dBy/dy), wherein $\beta$ is the second angle, a tan 2( ) is the two-argument arctangent function, dBy/dy is the second magnetic field gradient, dBz/dy is the fourth magnetic field gradient, and K2 and K4 are predefined constants.

In an embodiment, the magnet is movable such that a virtual axis of the magnet is pivotable about a reference point (e.g. Pref) having a predefined position relative to the semiconductor substrate.

In an embodiment, the reference point (e.g. Pref) is located on the semiconductor substrate, thus in the same plane as the sensors.

In an embodiment, the reference point (e.g. Pref) is located on an imaginary axis perpendicular to the semiconductor substrate, at a predefined non-zero distance (e.g. dref) from said semiconductor substrate, e.g. above or below the semiconductor substrate. The reference point and the magnet may be located on the same side of the semiconductor substrate, or on opposite sides. The reference point may be located between the substrate and the magnet, when the magnet is in its neutral position (i.e. oriented with its axis perpendicular to the semiconductor substrate), or within the space defined by the magnet (when its its neutral position), or the magnet (when in its neutral position) may be located between the reference position and the semiconductor substrate.

In certain embodiments, a ratio (dref/H) of the distance "dref" and the (axial) height H of the magnet may be a value in the range from 50% to 200%, or in the range from 50% to 150%, or in the range from 75% to 125%.

In an embodiment, a first distance (e.g. $\Delta X$) between the first sensor location and the second sensor location is substantially equal to a second distance (e.g. $\Delta Y$) between the third sensor location and the fourth sensor location. In this embodiment, the sensors may be located on a virtual circle. The reference point may be located at the centre of this circle, or may be located on a virtual line perpendicular to the substrate and passing through said centre of the circle, at a predefined non-zero distance from the substrate.

In an embodiment, a first distance (e.g. $\Delta X$) between the first sensor location and the second sensor location is at least 5% larger or at least 5% smaller than a second distance (e.g. $\Delta Y$) between the third sensor location and the fourth sensor location. In this embodiment, the sensors may be located on a virtual ellipse. The reference point may be located at the centre of this ellipse, or may be located on a virtual line perpendicular to the substrate and passing through said centre of the ellipse, at a predefined non-zero distance from the substrate.

In an embodiment, each of the four sensors comprises an integrated magnetic concentrator and two horizontal Hall elements.

The integrated magnetic concentrator (also known as "integrated flux concentrator") may have a disk shape with a diameter in the range from 150 μm to 250 μm, e.g. in the range from 170 μm to 230 μm, for example equal to about 200 μm.

In an embodiment, the first sensor comprises a first integrated magnetic concentrator and a first and a second horizontal Hall element situated on opposite sides of the first IMC on a first virtual line oriented in the first direction, and the second sensor comprises a second integrated magnetic concentrator and a third and a fourth horizontal Hall element situated on said first virtual line on opposite sides of the second IMC; and the third sensor comprises a third integrated magnetic concentrator and a fifth and a sixth horizontal Hall element situated on opposite sides of the third IMC on a second virtual line oriented in the second direction, and the fourth sensor comprises a fourth integrated magnetic concentrator and a seventh and an eighth horizontal Hall element situated on said second virtual line on opposite sides of the fourth IMC.

An example of such an arrangement is shown in FIG. 5.

In an embodiment, each of the four sensors comprises a horizontal Hall element and a vertical Hall element. In this embodiment, the sensor device preferably does not contain magnetic flux concentrators (IMC).

In an embodiment, each of the four sensors comprises a horizontal Hall element and at least one magneto-resistive sensor element. Also in this embodiment, the sensor device preferably does not contain magnetic flux concentrators (IMC).

In an embodiment, the first sensor comprises a first horizontal Hall element and a first vertical Hall element, and wherein the second sensor comprises a second horizontal Hall element and a second vertical Hall element, wherein each of the first and second vertical Hall element have an axis of maximum sensitivity oriented in the first direction; and the third sensor comprises a third horizontal Hall element and a third vertical Hall element, and wherein the fourth sensor comprises a fourth horizontal Hall element and a fourth vertical Hall element, wherein each of the third and fourth vertical Hall element have an axis of maximum sensitivity oriented in the second direction.

In an embodiment, the processing circuit is integrated in the semiconductor substrate. Thus, in this embodiment, the sensor elements and the processing circuit are integrated on a single substrate.

According to a second aspect, the present invention also provides a position sensor system comprising: a sensor device according to the first aspect; and a magnet pivotable about a reference point (e.g. Pref) having a predefined position relative to the semiconductor substrate. This means that the magnet is movable in a manner such that it rotates about said predefined reference position, e.g. as illustrated in FIG. 1. In the magnet has a cylindrical or spherical shape, the magnet may also be rotatable about its own axis, but such rotation does not change the magnetic field lines.

The magnet may be a two-pole magnet, e.g. having a cylindrical shape, or a bar-shape, or a spherical shape.

In an embodiment, the system further comprises a joystick connected to the magnet.

According to a third aspect, the present invention also provides a method of determining an orientation (e.g. by means of two angles $\alpha, \beta$) of a magnet which is pivotable about a reference point (e.g. Pref) having a predefined position relative to a semiconductor substrate, the method comprising:
a) determining at least two of the following magnetic field gradients: i) a first magnetic field gradient (e.g. dBx/dx) of a first magnetic field component oriented in a first direction parallel to a semiconductor substrate along said first direction; ii) a second magnetic field gradient (e.g. dBy/dy) of a second magnetic field component oriented in a second direction parallel to the semiconductor substrate and perpendicular to the first direction, along said second direction; iii) a third magnetic field gradient (e.g. dBz/dx) of a third magnetic field component oriented in a third direction perpendicular to the semiconductor substrate along said first direction; iv) a fourth magnetic field gradient (e.g. dBz/dy) of the third magnetic field component oriented in the third direction along said second direction; b) determining a first angle formed between an orthogonal projection of the axis of the magnet on a first virtual plane (e.g. XZ) parallel to the first direction (e.g. X) and the third direction (e.g. Z), based on at least some of said magnetic field gradients; and c) determining a second angle formed between an orthogonal projection of the axis of the magnet on a second virtual plane (e.g. YZ) parallel to the second direction and the third direction, based on at least some of said magnetic field gradients.

In an embodiment, step a) comprises: determining only two magnetic field gradients, namely: dBz/dx and dBz/dy; and step b) comprises: determining the first angle (e.g. $\alpha$) as a function of only one magnetic field gradient, namely: dBz/dx; and step c) comprises: determining the second angle (e.g. $\beta$) as a function of only one other magnetic field gradient, namely: dBz/dy.

In an embodiment, said first angle is determined based on at least the first magnetic field gradient (e.g. dBx/dx) and the third magnetic field gradient (e.g. dBz/dx); and said second angle is determined based on at least the second magnetic field gradient (e.g. dBy/dy) and the fourth magnetic field gradient (e.g. dBz/dy).

In an embodiment, said first angle is determined solely based on the first magnetic field gradient (e.g. dBx/dx) and the third magnetic field gradient (e.g. dBz/dx); and said second angle is determined solely based on the second magnetic field gradient (e.g. dBy/dy) and the fourth magnetic field gradient (e.g. dBz/dy).

In an embodiment, the first angle is determined in accordance with the formula:
$\alpha = K1 * a\tan 2(dBz/dx, dBx/dx)$, wherein $\alpha$ is the first angle, a tan 2( ) is the two-argument arctangent function, dBx/dx is the first magnetic field gradient, dBz/dx is the third magnetic field gradient, and K1 is a first predefined constant; and the second angle is determined in accordance with the formula: $\beta = K2 * a\tan 2(dBz/dy, dBy/dy)$, wherein $\beta$ is the second angle, a tan 2( ) is the two-argument arctangent function, dBy/dy is the second magnetic field gradient, dBz/dy is the fourth magnetic field gradient, and K2 is a second predefined constant.

In an embodiment, the first angle is determined in accordance with the formula:
$\alpha = K1 * a\tan 2(K3 * dBz/dx, dBx/dx)$, wherein $\alpha$ is the first angle, a tan 2( ) is the two-argument arctangent function, dBx/dx is the first magnetic field gradient, dBz/dx is the third magnetic field gradient, and K1 and K3 are predefined constants; and the second angle is determined in accordance with the formula:
$\beta = K2 * a\tan 2(K4 * dBz/dy, dBy/dy)$, wherein $\beta$ is the second angle, a tan 2( ) is the two-argument arctangent function, dBy/dy is the second magnetic field gradient, dBz/dy is the fourth magnetic field gradient, and K2 and K4 are predefined constants.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

In FIG. 4(a) and FIG. 4(b) a sensor or sensor structure is situated at said reference position. As can be seen, the magnetic field line passing through the sensor location has the same orientation as the mechanical angle of the axis, and the distance between the sensor and the magnet is independent of the orientation of the axis.

In FIG. 4(c) and FIG. 4(d) the semiconductor substrate contains a plurality of sensors or sensor structures situated at sensor positions which are spaced from the reference position. As can be seen, the orientation of the magnetic field lines at the plurality of sensor locations is not the same as the orientation of the axis, and the distance between each of the sensor locations and the magnet is not constant but is dependent of the orientation of the axis.

Figure 1:
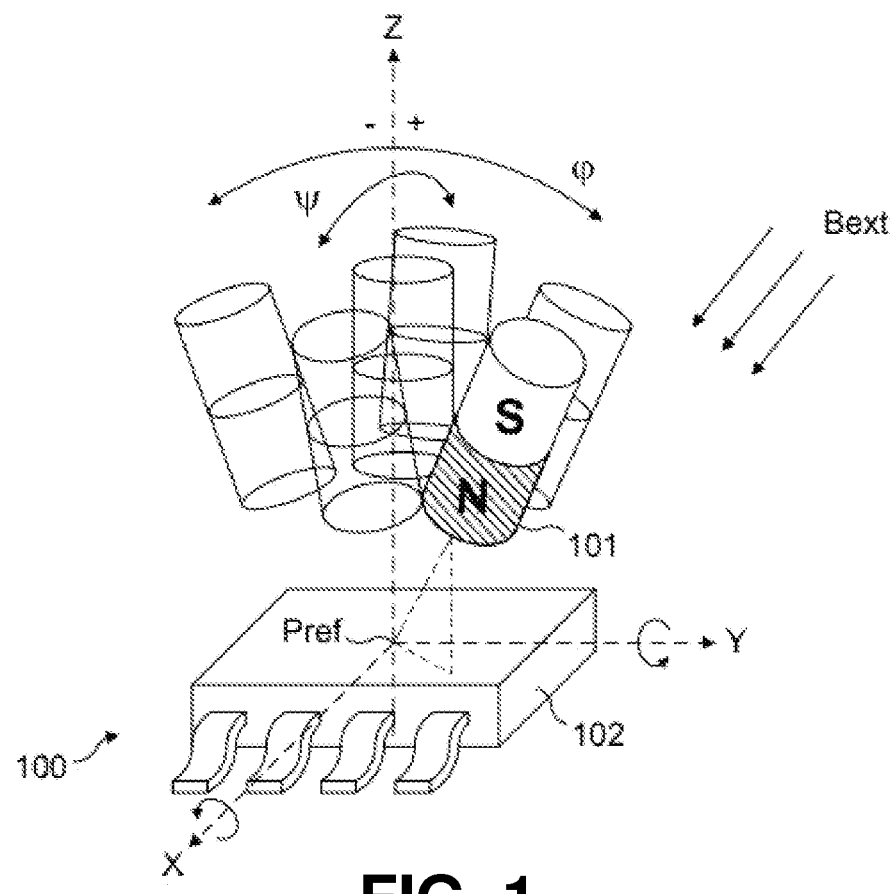
FIG. 1 is a schematic representation of a magnetic position sensor system comprising an axially magnetized magnet which is movable relative to a sensor device with at least two degrees of freedom.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, unless explicitly mentioned otherwise, the term "magnetic sensor device" or "sensor device" refers to a device comprising at least one "magnetic sensor" or at least one magnetic "sensor element", preferably integrated in a semiconductor substrate. The sensor device may be comprised in a package, also called "chip", although that is not absolutely required.

In this document, the term "sensor element" or "magnetic sensor element" or "magnetic sensor" can refer to a component or a group of components or a sub-circuit or a structure capable of measuring a magnetic quantity, such as for example a magneto-resistive element, a GMR element, an XMR element, a horizontal Hall plate, a vertical Hall plate, a Wheatstone-bridge containing at least one (but preferably four) magneto-resistive elements, etc. or combinations hereof.

In certain embodiments of the present invention, the term "magnetic sensor" or "magnetic sensor structure" may refer to an arrangement comprising one or more integrated magnetic concentrators (IMC), also known as integrated flux concentrators, and one or more horizontal Hall elements arranged near the periphery of the IMC, for example a disk-shaped IMC with two horizontal Hall elements 180° spaced from each other, or with four horizontal Hall elements 90° spaced from each other.

In this document, the expression "in-plane component of a magnetic field vector" and "projection of the magnetic field vector in the sensor plane" mean the same. If the sensor device is or comprises a semiconductor substrate, this also means a "magnetic field component parallel to the semiconductor plane". These components may be labelled Bx, By.

In this document, the expression "out-of-plane component of a vector" and "Z component of the vector" and "projection of the vector on an axis perpendicular to the sensor plane" mean the same. This component may be labelled Bz.

Embodiments of the present invention are typically described using an orthogonal coordinate system which is fixed to the sensor device, and having three axes X, Y, Z, where the X and Y axis are parallel to the substrate, and the Z-axis is perpendicular to the substrate.

In this document, the expression "spatial derivative" or "derivative" or "spatial gradient" or "gradient" are used as synonyms. In the context of the present invention, the gradient is typically determined as a difference between two values measured at two locations spaced apart along a certain direction. In theory the gradient is typically calculated as the difference between two values divided by the distance between the sensor locations, but in practice the division by said distance is often omitted, because the measured signals need to be scaled anyway.

In this application, horizontal Hall plates are typically referred to by H1, H2, etc., signals from these horizontal Hall plates are typically referred to by h1, h2, etc., vertical Hall plates are typically referred to by V1, V2, etc., and signals from these vertical Hall plates are typically referred to by v1, v2, etc.

In the context of the present invention, the formulas arctan(x/y), a tan 2(x,y), arccot(y/x) are considered to be equivalent.

The present invention is related to magnetic position sensor systems, methods and devices for measuring an orientation of a magnet which is pivotable about a fixed reference point "Pref". This fixed reference point may be located on a semiconductor substrate or may be located at a predefined distance "dref" above or below a semiconductor substrate. The magnet may be connected to a joystick (not shown).

In preferred embodiments, the system has an improved accuracy, e.g. because it is less sensitive to an external disturbance field.

Referring to the Figures.

FIG. 1 is a schematic representation of a magnetic position sensor system 100 comprising: a cylindrical magnet 101 and a sensor device 102.

The sensor device 102 comprises a semiconductor substrate (not shown in FIG. 1). A coordinate system with three orthogonal axis X, Y, Z is connected to the semiconductor substrate, such that the axes X and Y are parallel to the semiconductor substrate, and the axis Z is orthogonal to the semiconductor substrate.

The magnet 101 shown in FIG. 1 is a cylindrical magnet, more in particular an axially magnetized magnet 101. The magnet has a virtual axis "A" which intersects the semiconductor substrate at a fixed reference point "Pref", and can rotate in various directions. The distance between the magnet 101 and the reference point "Pref" is constant, hence the system has two degrees of freedom. The task of the sensor device 102 is to determine the orientation of the magnet.

The orientation can be uniquely defined for example by means of two angles $\varphi$ and $\psi$, where $\varphi$ is a negative or positive angle with respect to the Z-axis of an orthogonal projection of the axis A in the YZ-plane, and $\psi$ is a negative or positive angle with respect to the Z-axis of an orthogonal projection of the axis A in the XZ-plane. In the example shown, if the axis A of the magnet is oriented perpendicular to the semiconductor substrate, the magnetic field vector B at the intersection of the axis A and the semiconductor substrate, is oriented in the negative Z-direction, $\varphi=0°$ and $\psi=0°$. The magnet is preferably movable at least in the range $\varphi$ from $-30°$ to $+30°$, and the range $\psi$ from $-30°$ to $+30°$, but of course larger ranges are also envisioned, e.g. $\pm 40°$, or $\pm 50°$, or $\pm 60°$. Specifying the orientation of the magnet 101 by means of the angles $\varphi$ and $\psi$ is, however, not the only possible way.

Figure 2:
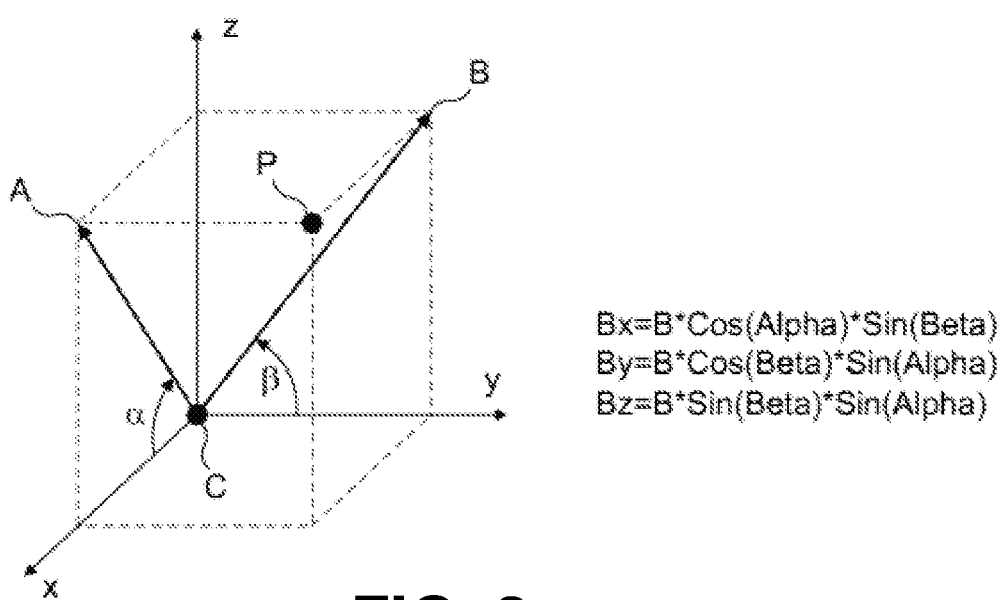
FIG. 2 shows how a random orientation of a line segment [CP] can be represented by two angles $\alpha$ and $\beta$.

FIG. 2 shows another way of defining the orientation of a vector of a constant length [CP] starting from the reference point "C", and ending at a point "P" on an imaginary sphere. The vector [CP] is not shown, but a first orthogonal projection [CA] of the vector [CP] onto the plane XZ is shown, and a second orthogonal projection [CB] of the vector [CP] onto the plane YZ is shown. The orientation of an axis A passing through the points C and P can also be defined by a first angle $\alpha$ between the positive X-axis and the vector [CA], and by a second angle $\beta$ between the positive Y-axis and the vector [CB]. As an example, if the magnet axis is oriented perpendicular to the plane XY (i.e. perpendicular to the semiconductor substrate), also referred to as the "neutral position", $\alpha=90°$ and $\beta=90°$. This corresponds to the orientation in which $\varphi=0°$ and $\psi=0°$, described above.

The following formulas apply:

$$Bx = B * \cos(\alpha) * \sin(\beta) \quad [1]$$

$$By = B * \cos(\beta) * \sin(\alpha) \quad [2]$$

$$Bz = B * \sin(\beta) * \sin(\alpha) \quad [3]$$

Division of [3] and [1] yields:

$$(Bz/Bx) = \tan(\alpha) \quad [4]$$

$$(Bz/By) = \tan(\beta) \quad [5]$$

where Bx is the magnetic field component oriented in the X-direction, By is the magnetic field component oriented in the Y-direction, Bz is the magnetic field component oriented in the Z-direction, and B is the magnitude of the magnetic field vector.

In preferred embodiments, the angles $\alpha$ and $\beta$ are values in the range from 900±30°, or in the range from 900±40°, or in the range from 900±50°, or in the range from 90°±60°.

Figure 3:
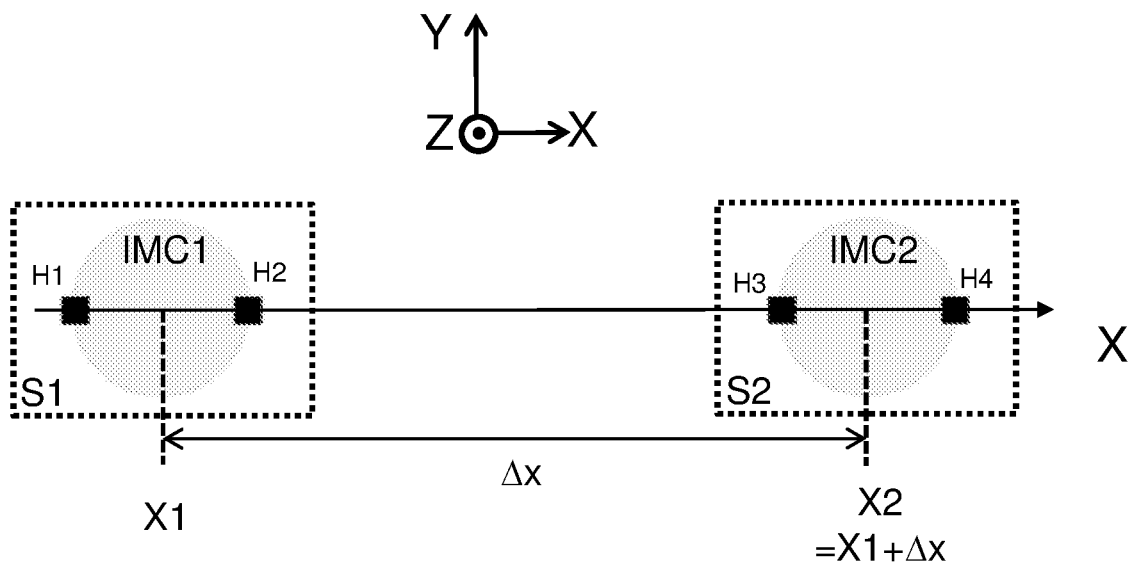
FIG. 3 is a schematic block-diagram of a sensor structure as may be used in embodiments of the present invention. The sensor structure comprises a first sensor at a first location X1, and a second sensor at a second location X2 along an X-axis, each sensor comprising an integrated magnetic concentrator (IMC) and two horizontal Hall elements arranged on opposite sides of the IMC. An in-plane magnetic field gradient (dBx/dx) and an out-of-plane magnetic field gradient (dBz/dx) can be measured by this sensor structure.

FIG. 3 shows a semiconductor substrate comprising a first sensor (or sensor structure) S1 located at a first sensor location X1 on an X-axis, and a second sensor (or sensor structure) S2 located at a second sensor location X2 on said X-axis, spaced from X1. Each of the first and second sensor S1, S2 comprises a disk shaped integrated magnetic concentrator (IMC) and two horizontal Hall elements arranged on the X-axis, on opposite sides of the IMC. The first sensor S1 comprises a first horizontal Hall element H1 configured for providing a first signal h1, and a second horizontal Hall element H2 configured for providing a second signal h2. The second sensor S2 comprises a third horizontal Hall element H3 configured for providing a third signal h3, and a fourth horizontal Hall element H4 configured for providing a fourth signal h4.

In order to understand the present invention, it suffices to know that the signals h1 and h2 of the first sensor S1 can be combined to determine both an in-plane magnetic field component Bx1 (parallel to the semiconductor substrate) and an out-of-plane magnetic field component Bz1 (perpendicular to the semiconductor substrate). More in particular, the in-plane magnetic field component Bx1 is parallel to the X-axis, and can be calculated by a subtraction of the signals h1 and h2, and the out-of-plane magnetic field component Bz1 is parallel to the Z-axis, and can be calculated by a summation of the signals h1 and h2. This can be expressed mathematically as follows:

$$Bx1 = (h2 - h1) \quad [6]$$

$$Bz1 = (h2 + h1) \quad [7]$$

Likewise, the in-plane magnetic field component Bx2, and the out-of-plane magnetic field component Bz2 at the second sensor location X2 can be determined, e.g. in accordance with the following formulas:

$$Bx2 = (h4 - h3) \quad [8]$$

$$Bz2 = (h4 + h3) \quad [9]$$

And from these values an in-plane magnetic field gradient dBx/dx and an out-of-plane magnetic field gradient dBz/dx can be determined, e.g. in accordance with the following formulas:

$$\Delta Bx/\Delta x = Bx2 - Bx1 \quad [10]$$

$$\Delta Bz/\Delta x = Bz2 - Bz1 \quad [11]$$

It is noted that the division by "Δx" is typically omitted, because the distance is constant, and the values obtained from the Hall elements need to be scaled anyway, but the notation ΔBz/Δx (or dBz/dx) is useful in this application, because it indicates not only that a difference between two Bz values is taken, but also indicates along which direction, which in the case of Δx is the X-direction. As known in the art, gradient signals are highly insensitive to an external disturbance field.

It is noted that a sensor device (not shown in FIG. 3, but see e.g. FIG. 6) having two sensors S1, S2 spaced apart by a distance ΔX, wherein the first sensor S1 comprises one horizontal Hall element H1 and one vertical Hall element V1 with its axis of maximum sensitivity oriented in the X-direction, and wherein the second sensor S2 comprises one horizontal Hall element H2 and one vertical Hall element V2 with its axis of maximum sensitivity oriented in the X direction, is also capable of measuring Bx1, Bz1 and Bx2, Bz2 respectively, and capable of determining two magnetic field gradients dBx/dx and dBz/dx. If v1 is the signal obtained from V1, v2 is the signal obtained from V2, h1 is the signal obtained from H1, and h2 is the signal obtained from H2, dBx/dx can be calculated as (v2−v1), and dBz/dx can be calculated as (h2−h1).

FIG. 4(a) to FIG. 4(d) are schematic representations of a cylindrical magnet having a virtual axis "A" that intersects a semiconductor substrate (schematically indicated in dotted line) at a predefined position "Pref". The axis "A" is pivotable about the reference point "Pref". Only movement parallel to the XZ-plane is shown, in order not to overload the drawing.

Figure 4A:
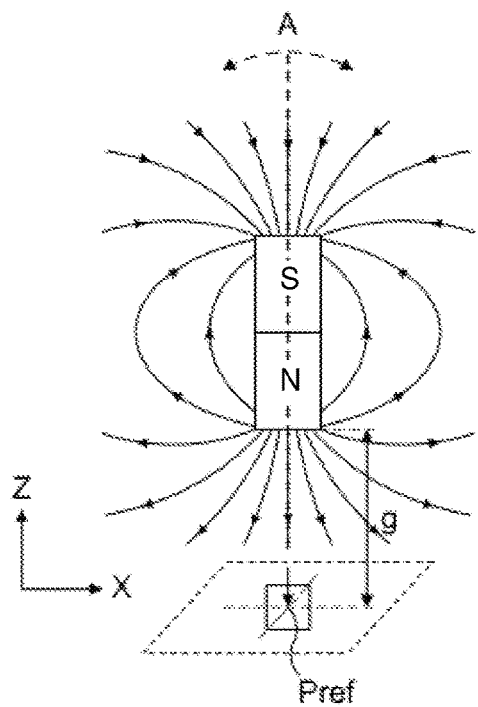
FIG. 4(a) to FIG. 4(d) are schematic representations of a cylindrical magnet having an axis that intersects a semiconductor substrate at a predefined reference position.
Figure 4B:
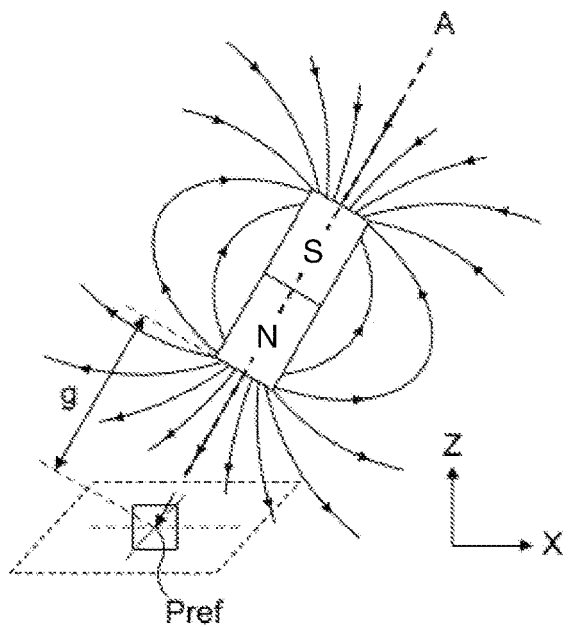

In FIG. 4(a) and FIG. 4(b) a sensor (schematically indicated by a black square) is situated at said reference position "Pref". As can be seen, the magnetic field line passing through the sensor location has the same orientation as the mechanical orientation of the axis "A" of the magnet, and the distance "g" between the sensor and the magnet is independent of the orientation of the axis.

Figure 4C:
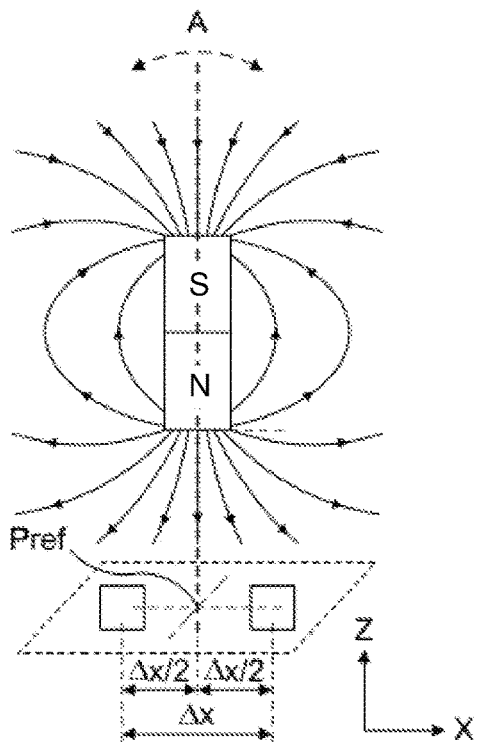
Figure 4D:
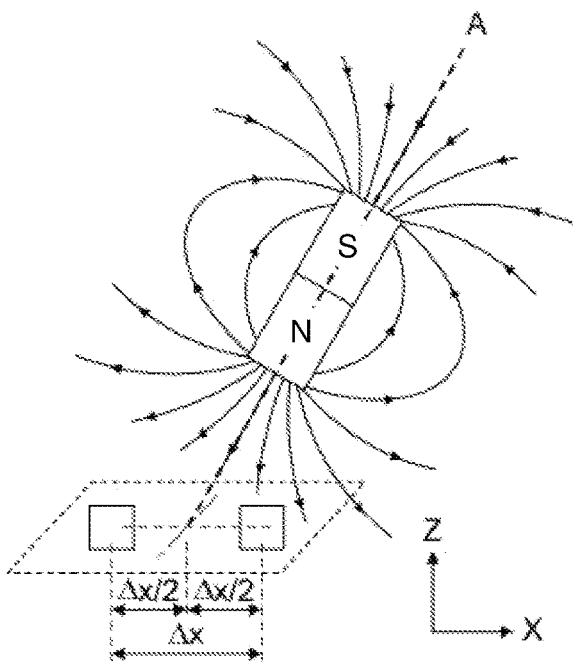

In FIG. 4(c) and FIG. 4(d) the semiconductor substrate contains a plurality of sensors spaced apart by a distance ΔX, and the reference position "Pref" is preferably in the middle between the sensor locations. As can be seen, the orientation of the magnetic field lines at the plurality of sensor locations is not the same anymore as the orientation of the axis A, and the distances between each of the sensor locations and the magnet is not constant anymore, but are dependent of the orientation of the axis "A".

As far as is known to the inventors, no general analytical formula or relation is known between the mechanical inclination angle of the axis A and the magnetic field components (Bx, By, Bz) at the two sensor locations, let alone a relation between said mechanical inclination angle and a magnetic field gradient dBx/dx as can be derived from the signals obtained from the two sensors located at a distance Δx/2 from the reference point. The inventors started a research project to investigate that relation. It was expected that this relation was highly non-linear, and mathematically very difficult to describe.

Figure 5:
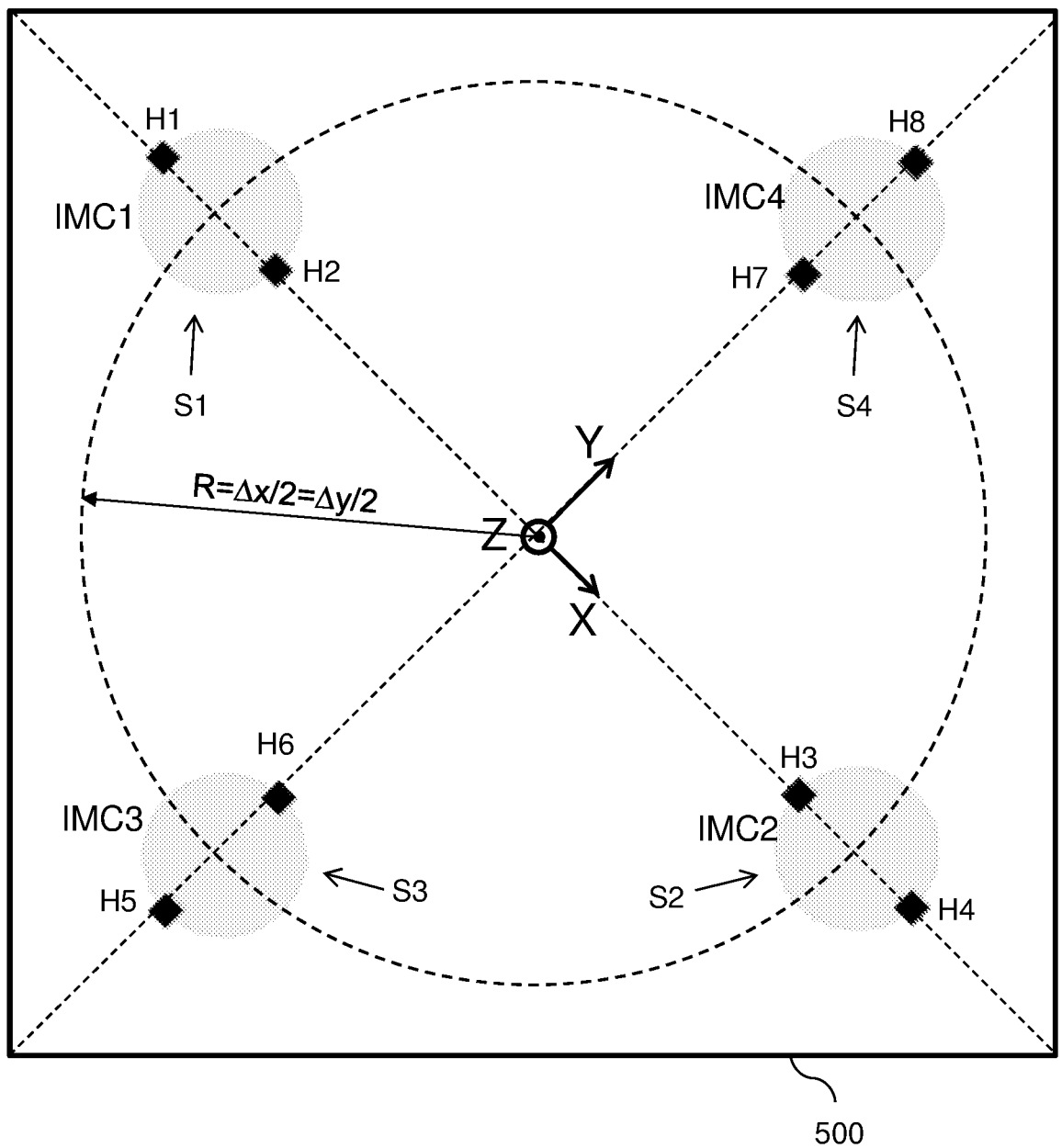
FIG. 5 is a schematic representation of a first sensor device proposed by the present invention.

FIG. 5 is a schematic representation of a first sensor device 500 proposed by the present invention.

The sensor device 500 comprises a semiconductor substrate comprising a plurality of magnetic sensors S1, S2, S3, S4 configured for determining:

i) a first magnetic field gradient dBx/dx of a first magnetic field component Bx oriented in a first direction X parallel to the semiconductor substrate, along said first direction X; and ii) a second magnetic field gradient dBy/dy of a second magnetic field component By oriented in a second direction Y parallel to the semiconductor substrate and perpendicular to the first direction X, along said second direction Y; and iii) a third magnetic field gradient dBz/dx of a third magnetic field component Bz oriented in a third direction Z perpendicular to the semiconductor substrate along said first direction X; and iv) a fourth magnetic field gradient dBz/dy of the third magnetic field component Bz oriented in the third direction Z along said second direction Y.

The sensor device 500 further comprises a processing circuit (not shown in FIG. 5, but see e.g. FIG. 9) configured for determining two angles, e.g. angles φ, ψ as illustrated in FIG. 1, or two angles α, β as illustrated in FIG. 2, defining the orientation of the axis A of a magnet, e.g. a magnet which is pivotable about a fixed reference point, based on these magnetic field gradients dBx/dx, dBy/dy, dBz/dx, dBz/dy.

The inventors surprisingly found that it is possible to define and calculate such angles based on said four magnetic field gradients, moreover in an analytical manner and with a relatively good approximation, e.g. with an absolute error smaller than ±10°, even in the presence of an external disturbance field. This was not expected.

They also found that it is possible to further improve this accuracy (i.e. decrease the absolute error to a value smaller than ±5° or smaller than ±3°) by post-processing, e.g. by remapping the calculated angles using two piecewise-linear approximation functions, one for each angle.

The processing circuit may be configured for determining a first angle α formed between an orthogonal projection of the axis A of the magnet on a first virtual plane XZ based on the first magnetic field gradient dBx/dx and the third magnetic field gradient dBz/dx, the virtual plane XZ being parallel to the first direction X and the third direction Z; and for determining a second angle β formed between an orthogonal projection of the axis A of the magnet on a second virtual plane YZ based on the second magnetic field gradient dBy/dy and the fourth magnetic field gradient dBz/dy, the virtual plane YZ being parallel to the second direction Y and the third direction Z.

It was found that specifying the orientation of the axis A of the magnet by means of these angles α, β (illustrated in FIG. 2), allows to calculate the angles using relatively simple mathematical expressions.

The plurality of magnetic sensors may comprise a first sensor S1, a second sensor S2, a third sensor S3 and a fourth sensor S4.

The first sensor S1 may be located at a first sensor location and the second sensor S2 is located at a second sensor location, both situated on a first virtual line oriented in the first direction X, and spaced apart from each other by a first non-zero distance ΔX. The first sensor S1 may be configured for measuring a first magnetic field component Bx1 oriented in the first direction X and a second magnetic field component Bz1 oriented in the third direction Z. The second sensor S2 may be configured for measuring a third magnetic field component Bx2 oriented in the first direction X and a fourth magnetic field component Bz2 oriented in the third direction Z.

The third sensor S3 may be located at a third sensor location and the fourth sensor S4 may be located at a fourth sensor location, both situated on a second virtual line oriented in the second direction Y, and spaced apart from each other by a second non-zero distance ΔY. The third sensor S3 may be configured for measuring a fifth magnetic field component By1 oriented in the second direction Y and a sixth magnetic field component Bz3 oriented in the third direction Z. The fourth sensor S4 may be configured for measuring a seventh magnetic field component By2 oriented in the first direction X and an eighth magnetic field component Bz4 oriented in the third direction Z.

The sensor device may be further configured for determining the first magnetic field gradient dBx/dx based on a difference between the first Bx1 and the third Bx2 magnetic field component; and for determining the second magnetic field gradient dBz/dx based on a difference between the second Bz1 and the fourth Bz2 magnetic field component; and for determining the third magnetic field gradient dBy/dy based on a difference between the fifth By1 and the seventh By2 magnetic field component; and for determining the fourth magnetic field gradient dBz/dy based on a difference between the sixth Bz3 and the eighth Bz4 magnetic field component.

In an embodiment, the distance ΔY is equal to the distance ΔX, in which case the four sensor locations are preferably located on a circle and the reference point "Pref" is preferably situated at the center of this circle.

In another embodiment, the distance ΔY is different from ΔX, e.g. at least 5% larger or smaller than ΔY, in which case the four sensor locations are preferably located on an ellipse, and the reference point "Pref" is preferably situated at the center of this ellipse. Using such embodiment, the size of the semiconductor substrate can be decreased, hence the compactness can be increased and the cost can be decreased. This may be particularly suited for joystick applications where the "handle" is movable over a larger range parallel to the YZ-plane (e.g. having at least three or four positions), as compared to the range parallel to the XZ-plane (e.g. having only two positions).

In the example of FIG. 5, each of the four sensors S1 to S4 comprises an integrated magnetic concentrator (IMC), and two horizontal Hall elements arranged near the periphery of the IMC, and spaced 180° apart.

More specifically, the first sensor S1 comprises a first integrated magnetic concentrator IMC1 and a first and a second horizontal Hall element H1, H2 situated on opposite sides of the first IMC on a first virtual line oriented in the first direction X. The second sensor S2 comprises a second integrated magnetic concentrator IMC2 and a third and a fourth horizontal Hall element H3, H4 situated on said first virtual line on opposite sides of the second IMC. The third sensor S3 comprises a third integrated magnetic concentrator IMC3 and a fifth and a sixth horizontal Hall element H5, H6 situated on opposite sides of the third IMC on a second virtual line oriented in the second direction Y. The fourth sensor S4 comprises a fourth integrated magnetic concentrator IMC4 and a seventh and an eighth horizontal Hall element H7, H8 situated on said second virtual line on opposite sides of the fourth IMC.

The integrated magnetic concentrator (also known as "integrated flux concentrator") may have a disk shape with a diameter in the range from 150 μm to 250 μm, e.g. in the range from 170 μm to 230 μm, for example equal to about 200 μm.

If h1 to h8 are the signals provided by the horizontal Hall elements H1 to H8 respectively, four gradient values may be calculated in accordance with the following formulas:

$$gr1=(dBx/dx)=Bx2-Bx1=(h4-h3)-(h2-h1) \quad [11]$$

$$gr2=(dBz/dx)=Bz2-Bz1=(h4+h3)-(h2+h1) \quad [12]$$

$$gr3=(dBy/dy)=By4-By3=(h8-h7)-(h6-h5) \quad [13]$$

$$gr4=(dBz/dy)=Bz4-Bz3=(h8+h7)-(h6+h5) \quad [14]$$

The inventors surprisingly found that the first angle α can be approximated very well by the following extremely simple formula:

$$\alpha=K1*a\tan 2(gr2,gr1) \quad [15a]$$

and that the second angle β can be approximated very well by the following extremely simple formula:

$$\beta=K2*a\tan 2(gr4,gr3) \quad [16a]$$

Since both angles α, β are calculated as a function of magnetic gradients, these angles are highly insensitive to an external disturbance field. Furthermore, since the angles are calculated based on a ratio of two gradients, these angles are also highly insensitive to temperature variations of the magnet and/or to ageing effects such as demagnetization.

The value of K1 and K2 may be determined by simulation, or by calibration, and may be stored in a non-volatile memory of the sensor device. The value of K1, K2 may depend on the size of the magnet (diameter, height), the distances Δx, Δy between the sensors, and the distance "g" between the magnet and the reference point "Pref".

But the present invention is not limited hereto, and the following formulas may also be used:

$$\alpha = K1 * a\tan 2(K3 * gr2, gr1) \quad [15b]$$

$$\beta = K2 * a\tan 2(K4 * gr4, gr3) \quad [16b]$$

where K3 and K4 are predefined constants, which will be discussed further in FIG. 7(c) and FIG. 8(c). Formulas [15b] and [16b] may provide more accurate results in case $\Delta x$ is different from $\Delta y$. Of course, many variants of the formulas are possible, such as e.g.:

$$\alpha = K1 * a\tan 2(gr2/K5, gr1) \quad [15c], \text{ or}$$

$$\alpha = K1 * a\tan 2(gr2, K6 * gr1) \quad [15d], \text{ or}$$

$$\alpha = K1 * a\tan 2(gr2, gr1/K7) \quad [15e],$$

where K5, K6, K7 are predefined constants. Similar variants are also possible for formula [16b].

Figure 6:
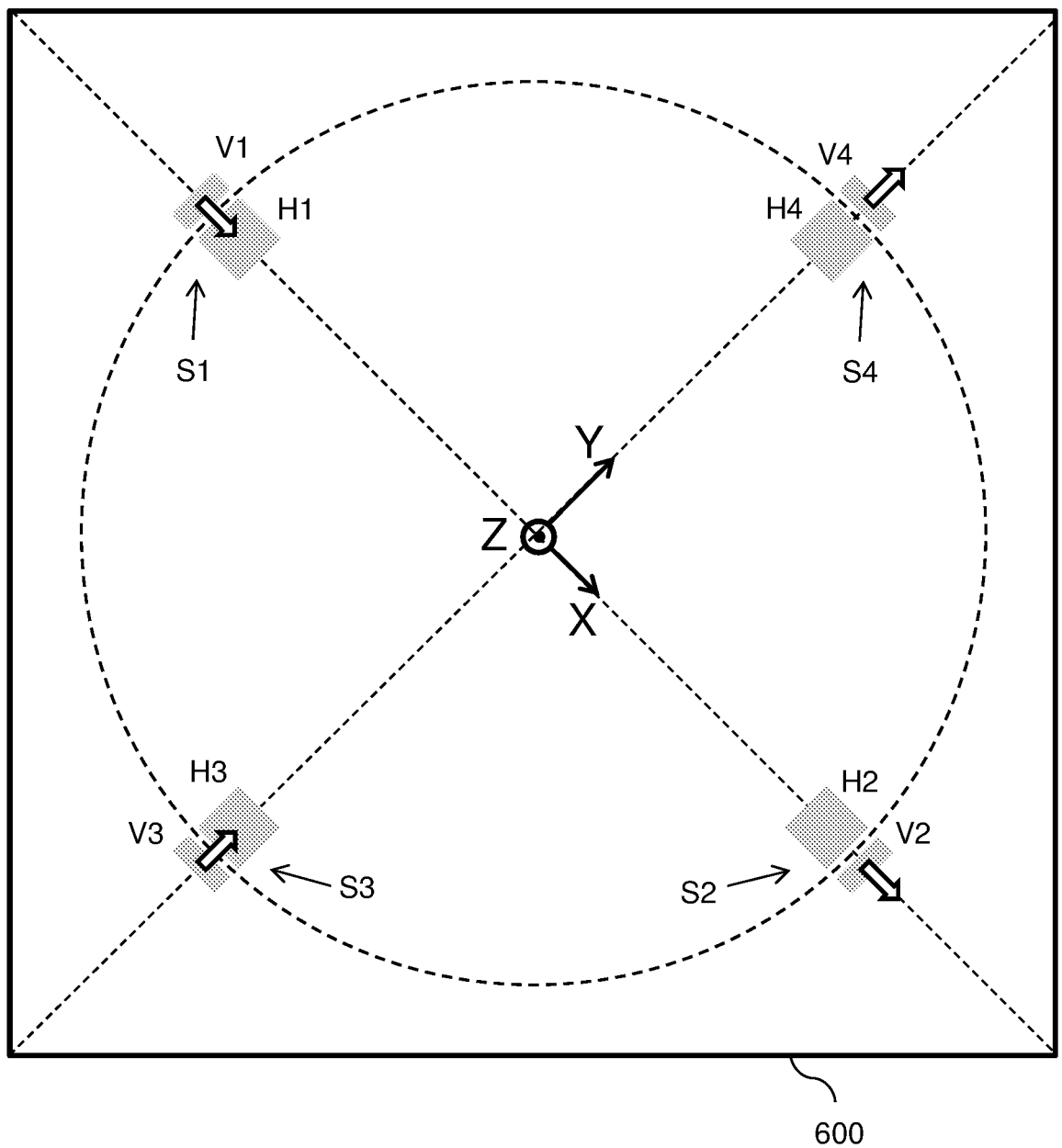
FIG. 6 is a schematic representation of another sensor device proposed by the present invention.

FIG. 6 is a schematic representation of another sensor device 600 proposed by the present invention, which can be seen as a variant of the sensor device of FIG. 5. The main difference being that each sensor comprises one Horizontal Hall element, and one vertical Hall element. Everything else described above is also applicable here, mutatis mutandis.

More specifically, in the example of FIG. 6, the first sensor S1 comprises a first horizontal Hall element H1 and a first vertical Hall element V1, and the second sensor S2 comprises a second horizontal Hall element H2 and a second vertical Hall element V2, and each of the first and second vertical Hall element V1, V2 has an axis of maximum sensitivity oriented in the first direction X. Likewise, the third sensor S3 comprises a third horizontal Hall element H3 and a third vertical Hall element V3, and the fourth sensor S4 comprises a fourth horizontal Hall element H4 and a fourth vertical Hall element V4 and each of the third and fourth vertical Hall element V3, V4 has an axis of maximum sensitivity oriented in the second direction Y.

If h1 to h4 are the signals provided by the horizontal Hall elements H1 to H4, and v1 to v4 are the signals provided by the vertical Hall elements V1 to V4, the first and second angle $\alpha$, $\beta$ may be calculated in accordance with the following set of formulas:

$$gr1 = (dBx/dx) = Bx2 - Bx1 = (v2 - v1) \quad [17]$$

$$gr2 = (dBz/dx) = Bz2 - Bz1 = (h2 - h1) \quad [18]$$

$$gr3 = (dBy/dy) = By4 - By3 = (v4 - v3) \quad [19]$$

$$gr4 = (dBz/dy) = Bz4 - Bz3 = (h4 - h3) \quad [20]$$

$$\alpha = K1 * a\tan 2(gr2, gr1) \quad [21a]$$

$$\beta = K2 * a\tan 2(gr4, gr3) \quad [22a]$$

Or using the following formulas:

$$\alpha = K1 * a\tan 2(K3 * gr2, gr1) \quad [21b]$$

$$\beta = K2 * a\tan 2(K4 * gr4, gr3) \quad [22b]$$

which may provide more accurate results in case $\Delta x$ is different from $\Delta y$.

In a variant of FIG. 6, the sensor device does not contain vertical Hall elements, but contains magneto-resistive elements instead.

In another variant, the vertical Hall elements of FIG. 6 are omitted, thus, the sensor device of FIG. 6 contains only four horizontal Hall elements.

Figure 7A:
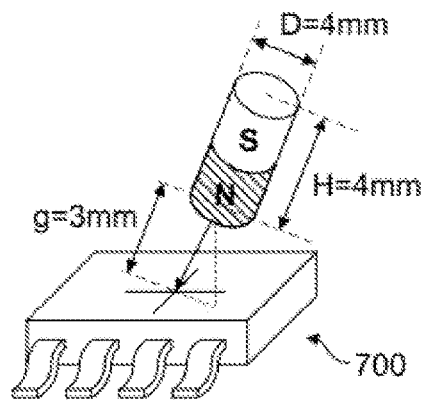
FIG. 7(a) to FIG. 7(e) show simulation results of a system proposed by the present invention.

FIG. 7(a) shows an illustrative sensor system 700, comprising a cylindrical magnet having a diameter D=4 mm, and a height H=4 mm, mounted at a distance g=3 mm from a reference point situated on the semiconductor substrate, between two sensors spaced apart by about 1.7 mm, each comprising an IMC with a diameter of about 190 μm and two horizontal Hall elements (e.g. as illustrated in FIG. 3 or FIG. 5).

FIG. 7(b) to FIG. 7(e) show simulation results of this sensor system.

Figure 7B:
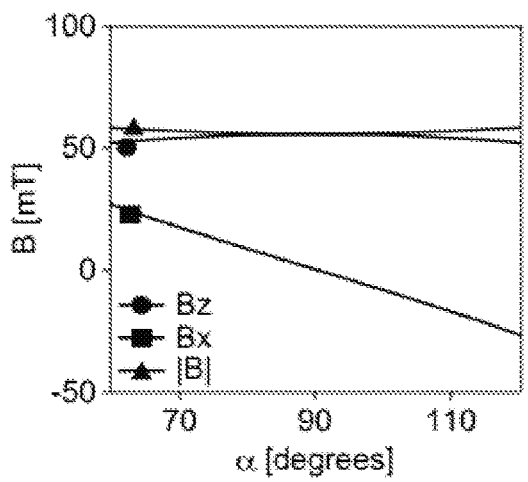

FIG. 7(b) shows a plot with waveforms of the magnetic field components Bx, Bz as a function of the mechanical angle $\alpha$ (as illustrated in FIG. 2) as would be measured by a sensor situated at the reference position "Pref" as illustrated in FIG. 4(a) and FIG. 4(b). The plot also shows a waveform of the magnitude Bl of the magnetic field calculated as the sum of squares of these components sqr(Bx)+sgr(Bz). As can be seen, this value is substantially constant.

Figure 7C:
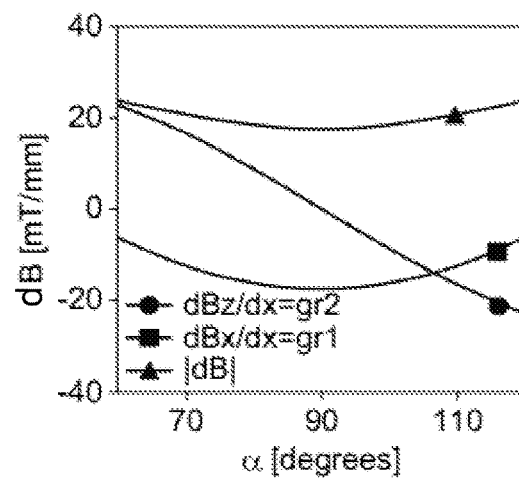

FIG. 7(c) shows a plot with waveforms of the magnetic field gradients gr2=dBz/dx and gr1=dBx/dx as a function of the mechanical angle $\alpha$, as can be derived from the signals measured by two sensors situated on opposite sides of the reference position "Pref" as illustrated in FIG. 4(c) and FIG. 4(d), hence as can be determined by a sensor device as shown e.g. in FIG. 5 or FIG. 6. The plot of FIG. 7(b) also shows a waveform of |dB| calculated as the sum of squares of these gradients sqr(dBx/dx)+sgr(dBz/dx). As can be seen, this value is rather constant but not perfectly constant, meaning that the gradient signals gr1 and gr2 are not perfect quadrature signals. The formulas [15b], [16b], [21b] and [22b] can take this discrepancy into account by choosing a value of K3 and K4 different from 1.00, e.g. in the range from 0.80 to 0.98 or in the range from 1.02 to 1.20.

But as mentioned above, it was surprisingly found that the signals resemble quadrature signals remarkably well, even without a K-factor.

Figure 7D:
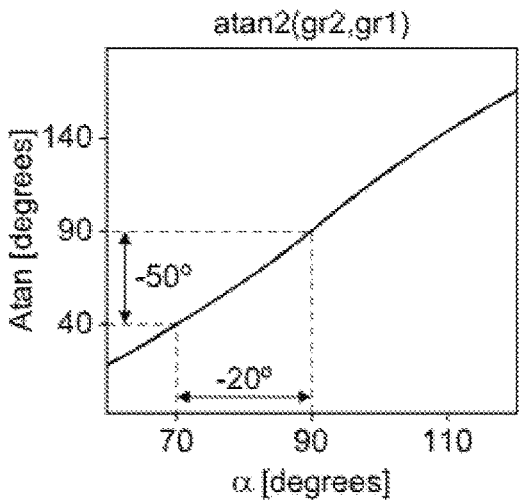

Indeed, FIG. 7(d) shows a curve obtained by the formula a tan 2(gr2,gr1). As can be seen, this curve is almost linear, and has a slope equal to about 2.5. Such high linearity was completely unexpected.

Figure 7E:
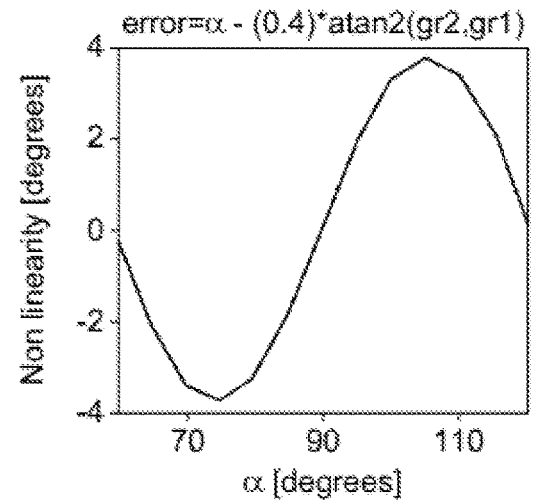

FIG. 7(e) shows the difference (or error) between the mechanical angle alpha, and the value calculated as (0.4)*a tan 2(gr2,gr1), i.e. by applying formula [15a] with K1=0.4. As can be seen, the error is smaller than ±4° for the mechanical angle alpha varying from about 60° to about 120°. Such a small error for such a simple formula could not have been predicted.

FIG. 7(a) tot FIG. 7(e) only show simulations for the angle $\alpha$, but these simulations are also representative for the second angle J, but in this case the labels of the curves would be "By" instead of "Bx" in FIG. 7(b), and "dBz/dy" instead of "dBz/dx" and "dBy/dy" instead of "dBx/dx" in FIG. 7(c).

As mentioned above, the inventors also found that this error can be further reduced to a value smaller than ±5°, or smaller than ±3°, or smaller than ±1.0°, or smaller than ±0.5°, or even smaller than ±0.2°, or smaller than ±0.1°, by known "post-processing techniques", e.g. based on remapping the curve of FIG. 7(d) using a piecewise-linear approximation, the parameters of which may be determined during a calibration step, and may be stored in a non-volatile memory of the sensor device.

It can be appreciated from FIG. 7(c) that the signal dBz/dx alone can also be used as a rough indication for the first angle, and similarly, the signal dBz/dy alone, can be used as a rough indication for the second angle. Depending on the application (e.g. a game console, an excavator, ... ) a rough indication may be sufficient, or may not be sufficient. The rough indication may be further improved by using a look-up table or a piece-wise-linear correction.

Figure 8A:
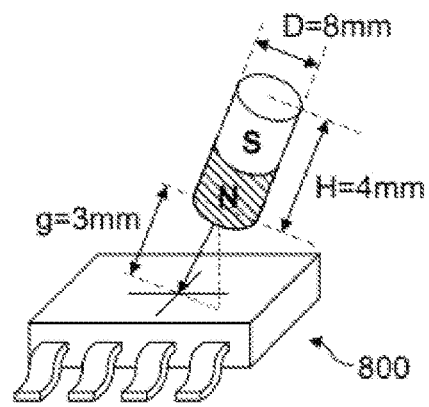
FIG. 8(a) to FIG. 8(e) show simulation results of another system proposed by the present invention.
Figure 8B:
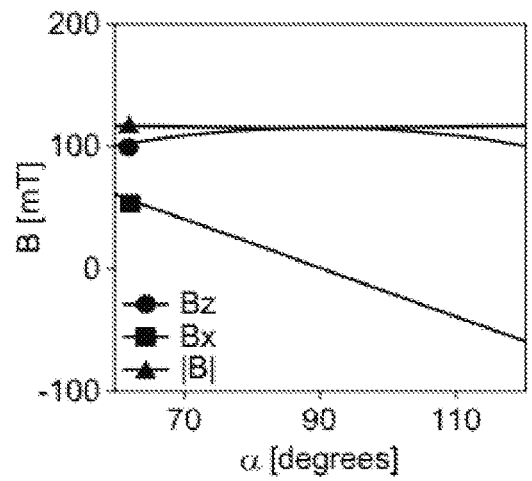
Figure 8C:
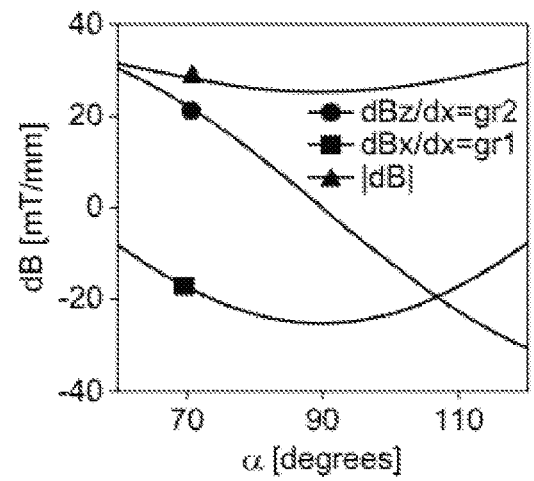

FIG. 8(a) shows an illustrative sensor system 800, comprising a cylindrical magnet with a diameter D=8 mm, and a height H=4 mm, mounted at a distance g=3 mm from a reference point "Pref" situated between two sensors spaced apart by about 1.7 mm, each comprising an IMC with a diameter of about 190 μm and two horizontal Hall elements (e.g. as illustrated in FIG. 3 or FIG. 5).

FIG. 8(b) to FIG. 8(e) show simulation results of this sensor system.

Figure 8D:
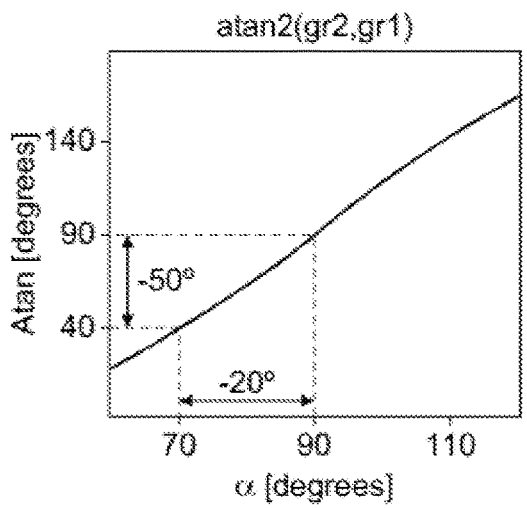
Figure 8E:
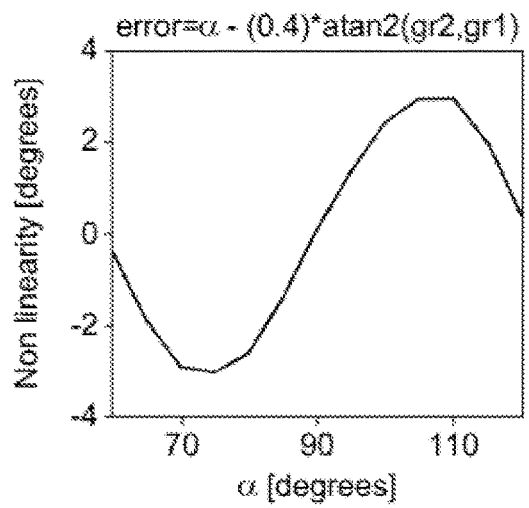

As can be seen, the curves of FIG. 8(b) to FIG. 8(e) are very much similar to those of FIG. 7(b) to FIG. 7(e), but the intrinsic linearity of the curve shown in FIG. 8(d) is improved, and the intrinsic error shown in FIG. 8(e) has decreased to a value within the range ±3°. (with "intrinsic linearity" is meant the linearity of the curve without "post-processing"). As mentioned above, the intrinsic linearity may also be improved using any of the formulas [15b], [16b], [21b] and [22b] with K3, K4 different from 1.00.

But of course, the present invention is not limited to sensor systems with the specific dimensions shown in the examples of FIG. 7(a) and FIG. 8(a), but also works for systems having for example the following combination of parameters:

| magnet outer diameter [mm] | magnet height [mm] | Δx, Δy [mm] | airgap (g) [mm] |
|---|---|---|---|
| 4 to 20 | 3 to 10 | 1.5 to 2.5 | 1.0 to 5.0 |
| 4 to 8 | 3 to 6 | 1.5 to 2.0 | 1.5 to 4.0 |

The skilled person having the benefit of the present disclosure, can easily find optimal values of K1, K2 and optionally K3, K4 (if used), e.g. by performing simulations, and/or a calibration test. The values of K1 to K4 may be stored in a non-volatile memory 931 of the sensor device (see e.g. FIG. 9).

Figure 9:
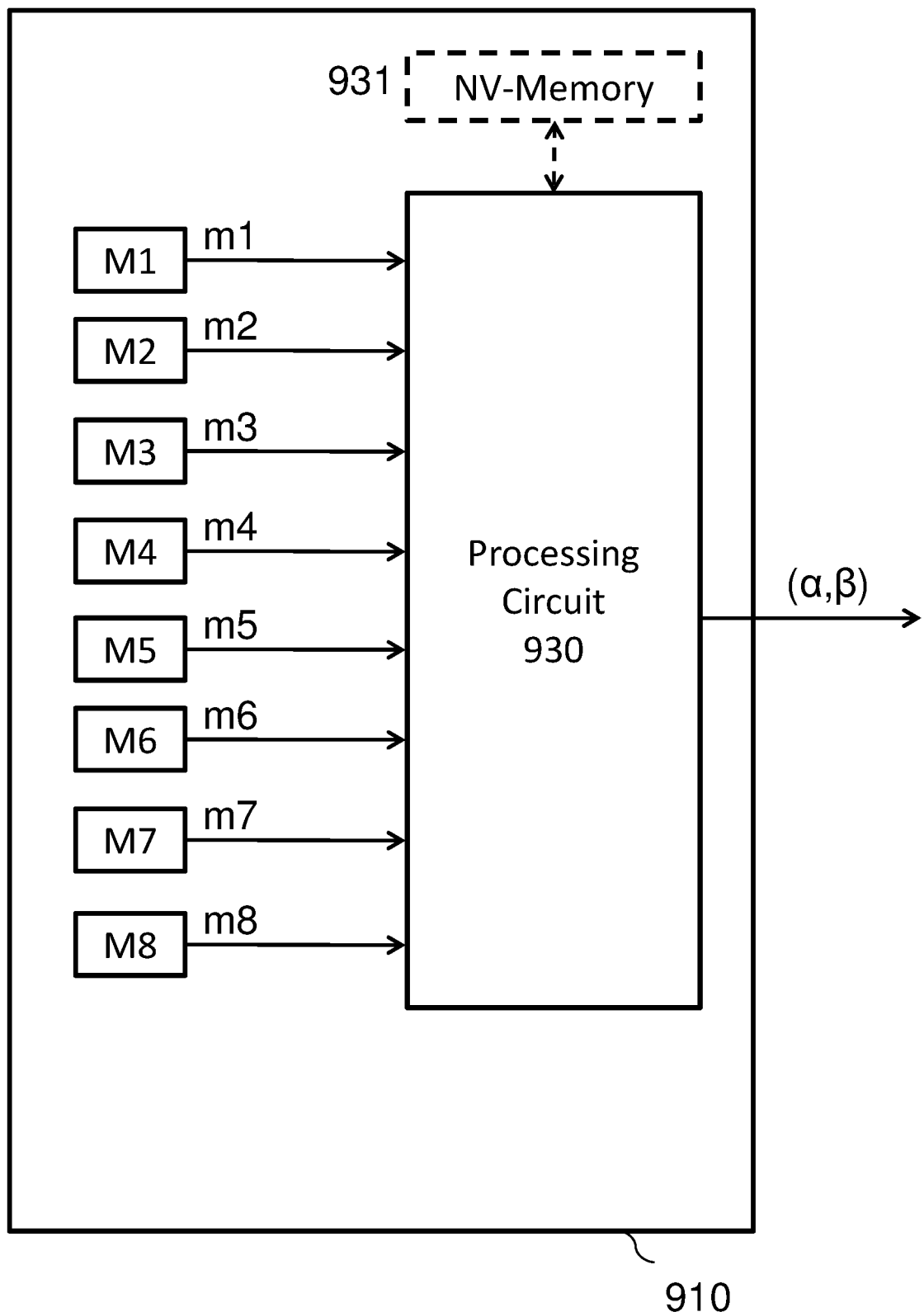
FIG. 9 shows an electrical block-diagram of a circuit that may be used in position sensor devices proposed by the present invention.

FIG. 9 shows an electrical block-diagram of a circuit 910 that may be used in position sensor devices described above. The circuit 910 comprises a plurality of magnetic sensor elements M1 to M8 (e.g. horizontal Hall elements, vertical Hall elements, MR elements, etc.), and a processing unit 930 (e.g. comprising analog components and/or digital components), and a non-volatile memory 931 (e.g. eeprom or flash). The biasing and readout of Hall sensors, or of circuits comprising MR elements is well known in the art, and hence need not be explained in further detail here.

This block-diagram can used for example in sensor devices having a sensor structure as illustrated in FIG. 5 or FIG. 6 or variants thereof.

The sensor device may be configured for measuring magnetic field components Bx1 and Bz1 at a first sensor location, Bx2 and Bz2 at a second sensor location, By1 and Bz3 at a third sensor location, By2 and Bz4 at a fourth sensor location, wherein the first and second sensor location are located on an X-axis, the third and fourth sensor location are located on an Y-axis perpendicular to the X-axis, wherein the sensor device is configured for determining an in-plane gradient dBx/dx and an out-of-plane gradient dBz/dx along the X-direction, and for determining an in-plane gradient dBy/dy and an out-of-plane gradient dBz/dy along the Y-direction, and for determining two angular values a, R based on these magnetic field gradients.

The first angle α and the second angle β may be determined in manners described above, for example by using the mathematical formulas [15a] and [15b], or [21a] and [21b] described above, and/or by using a look-up table, optionally with interpolation. Optionally a post-correction step is also applied, e.g. using a piecewise-linear correction for a, and using a piecewise-linear correction for β. The piecewise-linear correction for a may be independent from the piece-wise-linear correction for β.

The subtraction of signals for determining magnetic field components (e.g. h2−h1 of FIG. 5) and/or for determining magnetic field gradients (e.g. Bx2−Bx1 in FIG. 5, or v4−v3 in FIG. 6) may be performed in the analog domain before or after amplification, or in the digital domain.

The processing unit 930 may comprise a digital processor, which may optionally comprise or be connected to a non-volatile memory 931 (e.g. NVRAM or EEPROM or FLASH). This memory may be configured for storing one or more constants, for example K1, K2, and if used also K3, K4, and optionally also values or coefficients for the post-correction step, if applied. The digital processor 930 may for example be an 8-bit processor, or a 16-bit processor.

While not explicitly shown, the sensor device 910 may further comprise one or more components or sub-circuits selected from the group consisting of: an amplifier, a differential amplifier, an analog-to-digital convertor (ADC), a multiplexer, etc. The ADC may have a resolution of at least 8 bits, or at least 10 bits, or at least 12 bits, or at least 14 bits, or at least 16 bits.

It is a major advantage that the processing circuit does not have to perform a Fast Fourier Transform (FFT) or has to implement a neural network with hundreds of nodes.

Figure 10:
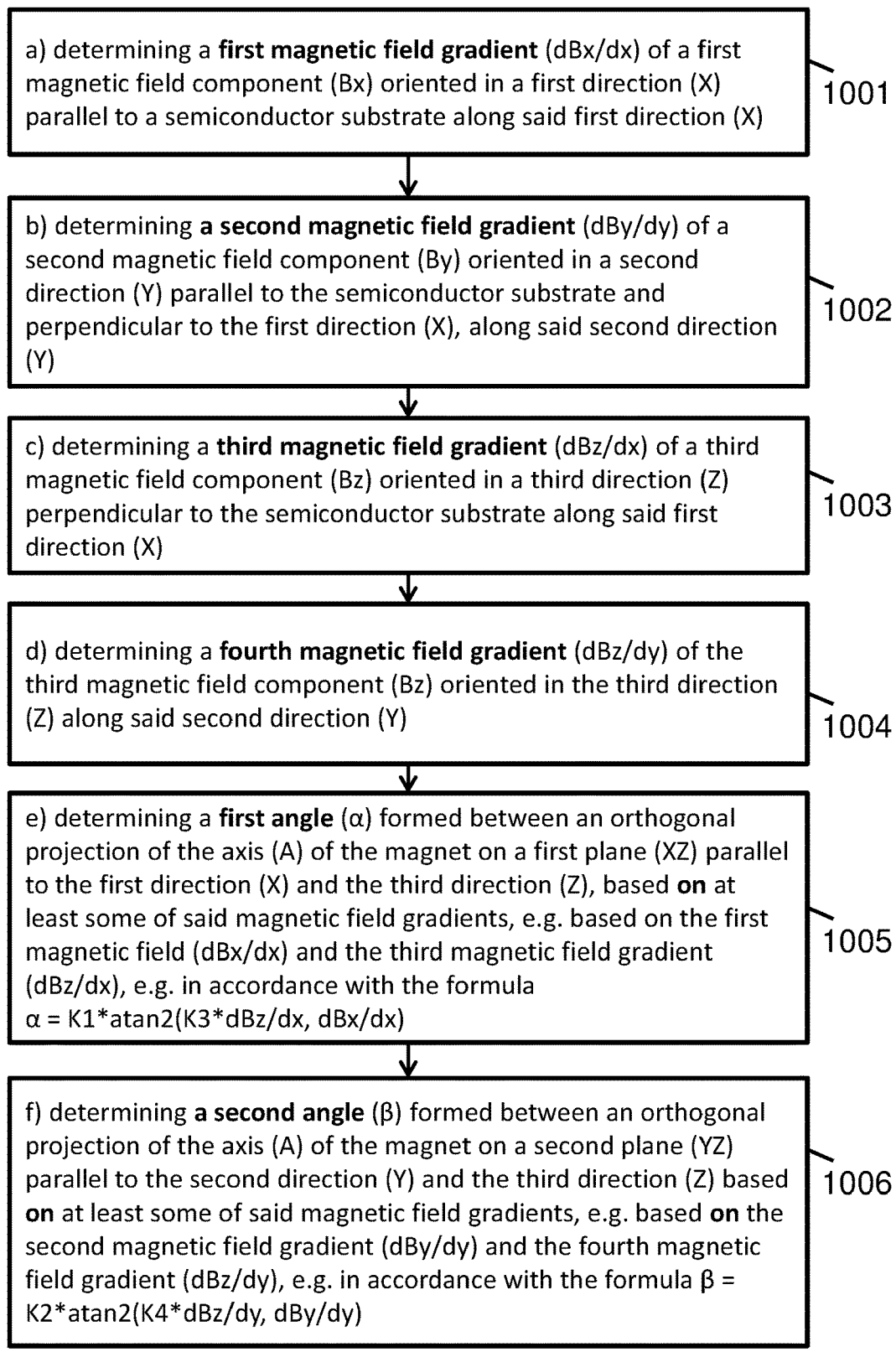
FIG. 10 shows a flow chart of a method of determining two angles α, β corresponding to the orientation of the axis of the magnet, proposed by the present invention.

FIG. 10 shows a flow chart of a method 1000 for determining an orientation (α,β) of a cylindrical magnet having an axis (A) relative to a reference point "Pref" situated on a semiconductor substrate, the method comprising:

a) determining 1001 a first magnetic field gradient dBx/dx of a first magnetic field component Bx oriented in a first direction X parallel to the semiconductor substrate along said first direction X;

b) determining 1002 a second magnetic field gradient dBy/dy of a second magnetic field component By oriented in a second direction Y parallel to the semiconductor substrate and perpendicular to the first direction X, along said second direction Y;

c) determining 1003 a third magnetic field gradient dBz/dx of a third magnetic field component Bz oriented in a third direction Z perpendicular to the semiconductor substrate along said first direction X;

d) determining 1004 a fourth magnetic field gradient dBz/dy of the third magnetic field component Bz oriented in the third direction Z along said second direction Y;

e) determining 1005 a first angle α formed between an orthogonal projection of the axis "A" of the magnet on a first virtual plane XZ parallel to the first direction X and the third direction Z, based on at least two of said magnetic field gradients; and f) determining 1006 a second angle β formed between an orthogonal projection of the axis "A" of the magnet on a second virtual plane YZ parallel to the second direction Y and the third direction Z, based on at least two of said magnetic field gradients.

Step e) may comprise: determining said first angle α solely based on the first magnetic field gradient dBx/dx and the third magnetic field gradient dBz/dx.

Step f) may comprise: determining said second angle β solely based on the second magnetic field gradient dBy/dy and the fourth magnetic field gradient dBz/dy.

Step e) may comprise determining the first angle α in accordance with formula [15a] or [15b].

Step f) may comprise determining the second angle β in accordance with formula [21a] or [21b].

The method may further comprise a post-correction step to improve the accuracy, e.g. to reduce or substantially eliminate the non-linearity error illustrated in FIG. 7(e) and FIG. 8(e).

In a variant of this method, (not explicitly shown), step a) and step b) are omitted, and step e) comprises: determining the first angle based on only one magnetic field gradient, namely: dBz/dx, and step f) comprises: determining the second angle based on only one magnetic field gradient, namely dBz/dy.

Above, systems are described in which a magnet is a cylindrical magnet which is pivotable about a reference point "Pref" situated on a semiconductor surface, but the present invention is not limited thereto, and also works if the magnet is a two-pole magnet with another shape (e.g. a spherical shape, or a bar-shape), and/or if the reference point "Pref" is situated at a fixed but non-zero distance "dref" from the semiconductor substrate.

Figure 11:
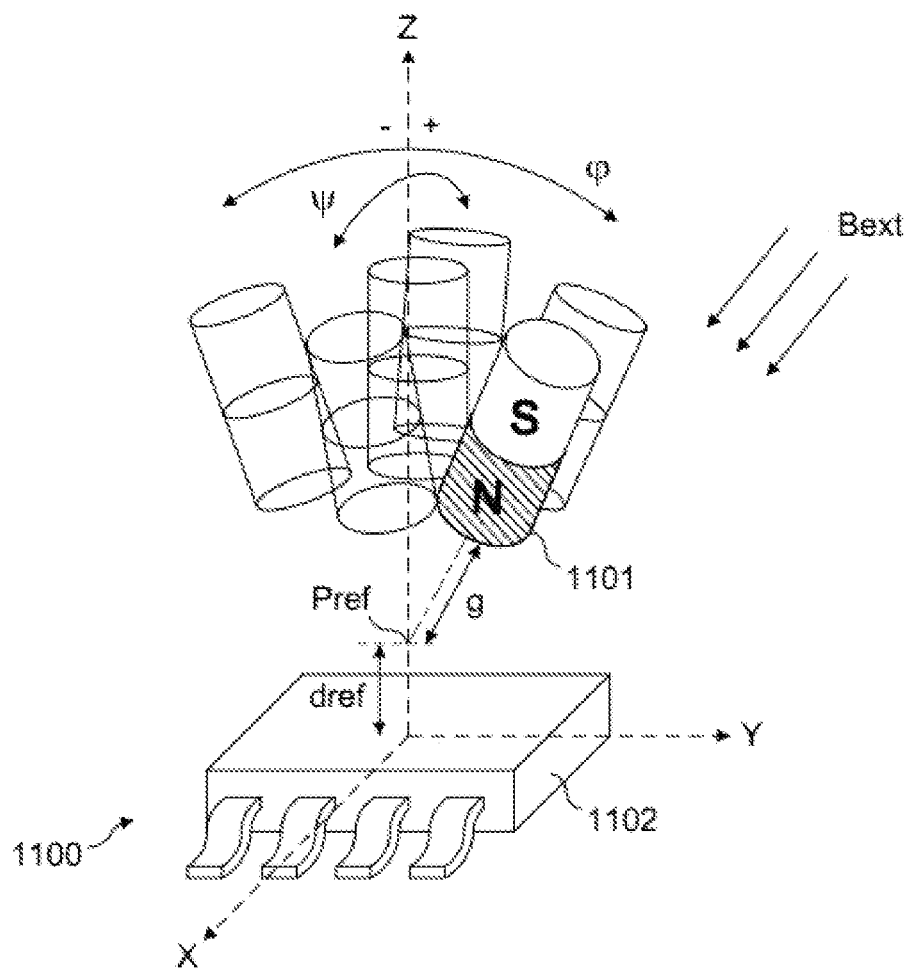
FIG. 11 shows a variant of the sensor system of FIG. 1, where the magnet is pivotable about a reference point which is situated at a predefined distance "dref" above the substrate.

FIG. 11 shows a variant of the sensor system of FIG. 1, where the magnet 1101 is pivotable about a reference point "Pref" which is situated at a predefined non-zero distance "dref" above a semiconductor substrate (not explicitly shown, but also defined by the XY-plane). In this example, the reference point "Pref" is located on the positive Z-axis, meaning that the magnet and the reference point are located on the same side of the substrate. But the present invention is not limited hereto, and the reference point may also be located on the negative Z-axis, i.e. on the opposite side of the substrate as the magnet.

The reference points "Pref" of the system shown in FIG. 1 and in FIG. 11 are situated outside of the space defined by the size of the cylindrical magnet and are located between the semiconductor substrate and the magnet, when the latter is in its neutral position (meaning, when α=0° and β=0°).

But the present invention is not limited thereto, and the present invention will also work if the (real or imaginary) reference point "Pref" about which the axis of the magnet is pivotable, is situated inside the space defined by the magnet, or above the space defined by the magnet.

It was found that the same formulas as described above for calculating α and β may also be used in these cases. Alternatively, the first angle α and the second angle β may be calculated as an "a tan 2" function (two-argument arctangent function) wherein each of the first argument and the second argument is a linear combination of two or more magnetic field gradients selected from the group consisting of dBx/dx, dBz/dx, dBy/dy and dBz/dy.

Optionally the sensor device may be further adapted for applying a post-processing on these angles, in manners known per se in the art, e.g. by applying a first piecewise-linear correction for the angle α, using a first set of predefined coefficients, and by applying a second piecewise-linear correction for the angle β, using a second set of predefined coefficients. These coefficients may be determined during a calibration step and may be stored in a non-volatile memory of the sensor device.

The invention claimed is:

1. A sensor device for determining a first and a second angle indicative of an orientation of a magnet having an axis, the sensor device comprising:
    a semiconductor substrate comprising a plurality of magnetic sensors configured for determining at least iii) and iv) of the following:
        i) a first magnetic field gradient of a first magnetic field component oriented in a first direction parallel to the semiconductor substrate along said first direction; and
        ii) a second magnetic field gradient of a second magnetic field component oriented in a second direction parallel to the semiconductor substrate and perpendicular to the first direction, along said second direction; and
        iii) a third magnetic field gradient of a third magnetic field component oriented in a third direction perpendicular to the first direction along said first direction; and
        iv) a fourth magnetic field gradient of the third magnetic field component oriented in a fourth direction perpendicular to the second direction along said second direction;
    a processing circuit configured for:
        determining said first angle based on at least the third magnetic field gradient; and
        determining said second angle based on at least the fourth magnetic field gradient.

2. The sensor device according to claim 1, wherein the plurality of magnetic sensors comprises a first sensor, a second sensor, a third sensor and a fourth sensor,
    the first sensor being located at a first sensor location and the second sensor being located at a second sensor location, situated on a first virtual line oriented in the first direction, and spaced apart from each other by a first distance,
    the first sensor being configured for measuring a first magnetic field component oriented in the first direction and a second magnetic field component oriented in the third direction,
    the second sensor being configured for measuring a third magnetic field component oriented in the first direction and a fourth magnetic field component oriented in the third direction;
    the third sensor being located at a third sensor location and the fourth sensor being located at a fourth sensor location, situated on a second virtual line oriented in the second direction, and spaced apart from each other by a second distance,
    the third sensor being configured for measuring a fifth magnetic field component oriented in the second direction and a sixth magnetic field component oriented in the third direction,
    the fourth sensor being configured for measuring a seventh magnetic field component oriented in the first direction and an eighth magnetic field component oriented in the third direction.

3. The sensor device according to claim 1, wherein the first angle is determined in accordance with the formula:

$$\alpha = K1 * a\tan 2(dBz/dx, dBx/dx),$$

wherein α is the first angle, a tan 2( ) is the two-argument arctangent function, dBx/dx is the first magnetic field gradient, and dBz/dx is the third magnetic field gradient, and K1 is a first predefined constant; and wherein the second angle is determined in accordance with the formula:

$$\beta = K2 * a\tan 2(dBz/dy, dBy/dy),$$

wherein β is the second angle, a tan 2( ) is the two-argument arctangent function, dBy/dy is the second magnetic field gradient, dBz/dy is the fourth magnetic field gradient, and K2 is a second predefined constant.

4. The sensor device according to claim 1, wherein the first angle is determined in accordance with the formula:

$$\alpha = K1 * a\tan 2(K3 * dBz/dx, dBx/dx),$$

wherein α is the first angle, a tan 2( ) is the two-argument arctangent function, dBx/dx is the first magnetic field gradient, dBz/dx is the third magnetic field gradient, and K1 and K3 are predefined constants; and wherein the second angle is determined in accordance with the formula:

$$\beta = K2 * a\tan 2(K4 * dBz/dy, dBy/dy),$$

wherein β is the second angle, a tan 2( ) is the two-argument arctangent function, dBy/dy is the second magnetic field gradient, dBz/dy is the fourth magnetic field gradient, and K2 and K4 are predefined constants.

5. The sensor device according to claim 1, wherein the magnet is movable such that a virtual axis of the magnet is pivotable about a reference point having a predefined position relative to the semiconductor substrate.

6. The sensor device according to claim 1, wherein a first distance between the first sensor location and the second sensor location is substantially equal to a second distance between the third sensor location and the fourth sensor location; or wherein a first distance between the first sensor location and the second sensor location is at least 5% larger or at least 5% smaller than a second distance between the third sensor location and the fourth sensor location.

7. The sensor device according to claim 1, wherein each of the four sensors comprises an integrated magnetic concentrator and two horizontal Hall elements.

8. The sensor device according to claim 1, wherein each of the four sensors comprises a horizontal Hall element and a vertical Hall element; or wherein each of the four sensors comprises a horizontal Hall element and at least one magneto-resistive sensor element.

9. The sensor device according to claim 1, wherein the processing circuit is integrated in the semiconductor substrate.

10. A position sensor system comprising:
a sensor device according to claim 1, the sensor device comprising a semiconductor substrate; and
a magnet pivotable about a reference point having a predefined position relative to the semiconductor substrate.

11. The position sensor system according to claim 10, wherein the system further comprises a joystick connected to the magnet.

12. A method of determining a first and a second angle indicative of an orientation of a magnet which is pivotable about a reference point having a predefined position relative to a semiconductor substrate, the method comprising:
a) determining at least iii) and iv) of the following magnetic field gradients:
i) a first magnetic field gradient of a first magnetic field component oriented in a first direction parallel to a semiconductor substrate along said first direction;
ii) a second magnetic field gradient of a second magnetic field component oriented in a second direction parallel to the semiconductor substrate and perpendicular to the first direction, along said second direction;
iii) a third magnetic field gradient of a third magnetic field component oriented in a third direction perpendicular to the first direction along said first direction;
iv) a fourth magnetic field gradient of the third magnetic field component oriented in a fourth direction perpendicular to the second direction along said second direction;
b) determining said first angle formed between an orthogonal projection of the axis of the magnet on a first virtual plane parallel to the first direction and the third direction, based on at least the third magnetic field gradient; and
c) determining said second angle formed between an orthogonal projection of the axis of the magnet on a second virtual plane parallel to the second direction and the third direction, based on at least the fourth magnetic field gradient.

13. The method according to claim 12, wherein the first angle is determined in accordance with the formula:

$$\alpha = K1 * a\tan 2(dBz/dx, dBx/dx),$$

wherein α is the first angle, a tan 2( ) is the two-argument arctangent function, dBx/dx is the first magnetic field gradient, dBz/dx is the third magnetic field gradient, and K1 is a first predefined constant; and wherein the second angle is determined in accordance with the formula:

$$\beta = K2 * a\tan 2(dBz/dy, dBy/dy),$$

wherein β is the second angle, a tan 2( ) is the two-argument arctangent function, dBy/dy is the second magnetic field gradient, dBz/dy is the fourth magnetic field gradient, and K2 is a second predefined constant.

14. The method according to claim 12, wherein the first angle is determined in accordance with the formula:

$$\alpha = K1 * a\tan 2(K3 * dBz/dx, dBx/dx),$$

wherein α is the first angle, a tan 2( ) is the two-argument arctangent function, dBx/dx is the first magnetic field gradient, dBz/dx is the third magnetic field gradient, and K1 and K3 are predefined constants; and wherein the second angle is determined in accordance with the formula:

$$\beta = K2 * a\tan 2(K4 * dBz/dy, dBy/dy),$$

wherein β is the second angle, a tan 2( ) is the two-argument arctangent function, dBy/dy is the second magnetic field gradient, dBz/dy is the fourth magnetic field gradient, and K2 and K4 are predefined constants.

15. The sensor device according to claim 1, wherein the processing circuit is configured for:
determining said first angle based only on the third magnetic field gradient; and
determining said second angle based only on the fourth magnetic field gradient.

16. The sensor device according to claim 15, wherein the processing circuit is configured for:
determining said first angle based on the third magnetic field gradient using a look-up table; and
determining said second angle based on the fourth magnetic field gradient using a look-up table.

17. The sensor device according to claim 1, wherein the processing circuit is configured for:
- determining said first angle based on at least the third magnetic field gradient and the first magnetic field gradient; and
- determining said second angle based only on the fourth magnetic field gradient and the second magnetic field gradient.

18. The sensor device according to claim 1,
- wherein the third direction is perpendicular to the semiconductor substrate; and
- wherein the fourth direction is perpendicular to the semiconductor substrate.

* * * * *